(12) United States Patent
Schulz-Harder et al.

(10) Patent No.: US 8,377,240 B2
(45) Date of Patent: Feb. 19, 2013

(54) METHOD FOR THE PRODUCTION OF A METAL-CERAMIC SUBSTRATE OR COPPER-CERAMIC SUBSTRATE, AND SUPPORT TO BE USED IN SAID METHOD

(75) Inventors: Jurgen Schulz-Harder, Lauf (DE); Andreas Karl Frischmann, Vienna (AT); Alexander Rogg, Speinshart (DE); Karl Exel, Rimbach (DE)

(73) Assignee: Curamik Electronics GmbH, Eschenbach (DE)

( * ) Notice: Subject to any disclaimer, the term of this patent is extended or adjusted under 35 U.S.C. 154(b) by 360 days.

(21) Appl. No.: 11/666,426

(22) PCT Filed: Oct. 5, 2005

(86) PCT No.: PCT/DE2005/001781
§ 371 (c)(1),
(2), (4) Date: Apr. 27, 2007

(87) PCT Pub. No.: WO2006/045267
PCT Pub. Date: May 4, 2006

(65) Prior Publication Data
US 2007/0261778 A1   Nov. 15, 2007

(30) Foreign Application Priority Data

Oct. 27, 2004   (DE) .......................... 10 2004 052 280
Nov. 25, 2004   (DE) .......................... 10 2004 056 879

(51) Int. Cl.
*C03B 29/00*   (2006.01)

(52) U.S. Cl. ............... 156/89.18; 156/89.11; 156/89.12

(58) Field of Classification Search ............... 156/89.18, 156/89.12; 228/122.1; 438/106
See application file for complete search history.

(56) References Cited

U.S. PATENT DOCUMENTS

| | | | | |
|---|---|---|---|---|
| 4,259,061 A | * | 3/1981 | Dubetsky ........................ 432/13 |
| 4,483,810 A | * | 11/1984 | Bunk et al. .................. 156/89.16 |
| 4,906,509 A | * | 3/1990 | Nishio et al. ................... 428/148 |
| 5,336,453 A | * | 8/1994 | Giller et al. .................... 264/616 |
| 5,473,137 A | * | 12/1995 | Queriaud et al. ........ 219/121.64 |
| 5,603,875 A | | 2/1997 | Giller et al. |
| 5,675,181 A | * | 10/1997 | Nishiura et al. ............... 257/701 |
| 6,015,517 A | * | 1/2000 | Casey .............................. 264/44 |
| 6,033,787 A | | 3/2000 | Nagase et al. |
| 6,086,990 A | | 7/2000 | Sumino et al. |
| 2003/0054120 A1 | * | 3/2003 | Nakano et al. ............... 428/1.62 |
| 2003/0186483 A1 | * | 10/2003 | Choi ............................. 438/106 |
| 2004/0026482 A1 | | 2/2004 | Schulz-Harder |
| 2004/0060968 A1 | * | 4/2004 | Takahashi et al. ......... 228/122.1 |
| 2004/0131832 A1 | | 7/2004 | Tsukaguchi et al. |
| 2004/0166359 A1 | * | 8/2004 | Fukaya et al. ................ 428/639 |

FOREIGN PATENT DOCUMENTS

DE   10015614   4/2001
DE   20116816   4/2002

* cited by examiner

*Primary Examiner* — Philip Tucker
*Assistant Examiner* — Alex Efta
(74) *Attorney, Agent, or Firm* — Welsh Flaxman & Gitler LLC (57) ABSTRACT

A method is disclosed for producing metal-ceramic substrates that are metallized on both sides by using the direct bonding process. According to the method, at least one DCB stack made from first and a second metal layer and a ceramic layer located between said metal layers is formed on a separating layer of a support by heating to a direct bonding temperature. At least one of the metal layers rests against the separating layer during the bonding process, said separating layer being composed of a porous layer or coating made of a separating layer material from the group comprising mullite, $Al_2O_3$, $TiO_3$, $ZrO_2$, MgO, CaO $CaCO_2$ or a mixture of at least two of said materials.

27 Claims, 4 Drawing Sheets

METHOD FOR THE PRODUCTION OF A METAL-CERAMIC SUBSTRATE OR COPPER-CERAMIC SUBSTRATE, AND SUPPORT TO BE USED IN SAID METHOD

BACKGROUND OF THE INVENTION

The invention relates to a method for the production of a metal-ceramic substrate or a copper-ceramic substrate and to a carrier, such as a plate shaped carrier which can be used as a production aid in this method.

A method is known for the manufacture of the metallization required for strip conductors, connectors, etc., on a ceramic, e.g. on an aluminum-oxide ceramic, using the so-called direct-bonding process and, when copper is used as the metallization, also as the DCB (direct copper bonding) process, namely using metal or copper foils or metal or copper sheets forming the metallization, the surfaces of the foils or sheets having a layer or coating (melt-on layer) consisting of a chemical bond between the metal and a reactive gas, preferably oxygen. In this method, which is described for example in U.S. Pat. No. 3,744,120 and in DE-PS 23 19 854, this layer or coating (hot-melt layer) forms a eutectic with a melting temperature below the melting temperature of the metal (e.g. copper), so that the layers can be bonded to each other by placing the foil on the ceramic and heating all layers, namely by melting the metal or copper essentially only in the area of the hot-melt layer or oxide layer.

This DCB process then comprises, for example, the following process steps:
- oxidation of a copper foil so as to produce an even copper oxide layer;
- placing the copper foil on the ceramic layer;
- heating the composite to a process or bonding temperature between approx. 1025 and 1083° C., e.g. to approx. 1072° C.;
- cooling to room temperature.

In particular, double-sided metallized metal-ceramic substrates or copper-ceramic substrates are known, which are then manufactured using the DCB process wherein first a first copper layer is applied to a surface of a ceramic layer or a ceramic plate and then in a second step a second copper layer is applied to the other surface. The disadvantage of this is the increased complexity of the manufacturing process due to the double DCB bonding.

It is an object of the invention is to present or provide for a method that enables the manufacture of double-sided metallized metal-ceramic substrates, in particular of double-sided metallized copper-ceramic substrates, in one single processing or bonding step.

SUMMARY OF THE INVENTION

Processing aids in this method include at least one carrier designed preferably as a base plate. The base plate is provided with a separating layer on at least one surface to prevent bonding between the metal or copper contacting and this separating layer and the carrier. This makes it possible to provide on each separating layer a packet (hereinafter also "DCB packet") consisting of a bottom metal layer or plate directly adjacent to the separating layer, a ceramic layer or plate above that plate and a further metal layer or plate above that plate, and then to bond said DCB packet to the double-sided metallized metal-ceramic substrate by means of DCB bonding in a protective gas atmosphere with a low oxygen content and by heating to the bonding temperature (for example 1072° C.).

BRIEF DESCRIPTION OF THE DRAWINGS

The invention is described in more detail below based on the drawings, which show schematic depictions of various methods for manufacturing metal-ceramic substrates using the DCB technology or DCB method.

DETAILED DESCRIPTION OF THE INVENTION

Figure 1:
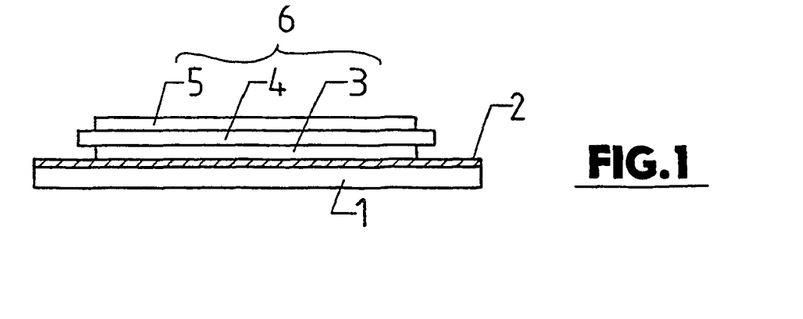
FIG. 1 illustrates a cross-sectional side view of a metal-ceramic substrate of the present invention.

In FIG. 1, 1 designates a base plate used as a production aid in the manufacture of a copper-ceramic substrate, said base plate being made of a highly heat-resistant material, for example of mullite, $ZrO_2$, $Al_2O_3$, AlN, $Si_3N_4$, SiC. The plate 1 is provided on its surface with a porous separating layer 2, with a thickness between 0.01 and 10 mm and a porosity (ratio of pore volume to solid volume) greater than 20%. The layer 2 consists of miniscule particles or a powder from a highly temperature-resistant material, for example mullite, $Al_2O_3$, $TiO_2$, $ZrO_2$, MgO, CaO, $CaCO_2$ and a particle size for example smaller than 30 µm. Combinations of two or more of the above materials or components are also suitable for the separating layer 2.

For the manufacture of the separating layer 2, a pulpy mass or suspension is used that is applied in a liquid or pasty matrix, in the simplest case consisting of water and possible with a bonding agent, to the respective surface of the base plate 1, namely for example by spreading or immersion. Afterwards, the bonding agent is dried and/or removed by heating, namely at a pre-treatment temperature greater than 150° C., for example. Then the particles forming the layer 2 can be "baked" or bonded at a higher temperature, however below the sintering temperature of the material used for the layer, e.g. at a temperature of approximately 1070° C., so that said layer 2 reaches the high porosity of more than 20%.

The base plate 1 has a thickness between 0.2 and 10 mm. The base plate 1 and therefore the production aid formed by said base plate and the separating layer 2 must be exceptionally even in order to achieve the required quality for the manufactured metal-ceramic substrate. The evenness is therefore greater than 0.2% of the length of the base plate 1, which can be rectangular for example, and in any case greater than 0.1% of the width of said base plate; i.e. deviations from an ideal, absolutely even plate must be less than 0.2% in the length and less than 0.1% in the width of the plate.

For the manufacture of a copper-ceramic substrate provided with a double copper metallization using the DCB technology, a first copper foil or plate 3, which is for example pre-oxidized, is first applied to the separating layer 2 of the horizontally oriented base plate 1 and then a ceramic layer or plate 4 is applied, followed by a further copper foil or plate 5, which is for example pre-oxidized. The DCB packet 6 thus formed on the base plate 1 is then heated on the base plate 1 in a low-oxygen protective gas atmosphere to the DCB temperature, for example to 1070° C., so that after the DCB process the two copper foils 3 and 5 are then bonded over the entire surface with the ceramic layer to the copper-ceramic substrate. After cooling, the double-sided metallized copper-ceramic substrate manufactured in one processing step can then easily be removed from the base plate 1 or from the separating layer 2 provided there. Any particles of the separating layer 2 adhering to the copper layer formed by the copper foil 3 are then removed by means of a suitable process. This can be suitably achieved by mechanical processes, such as brushing off, or by chemical processes, such as etching off a thin surface layer of the metallization formed by the copper foil 3. Combinations of such cleaning processes are also conceivable.

Figure 2:
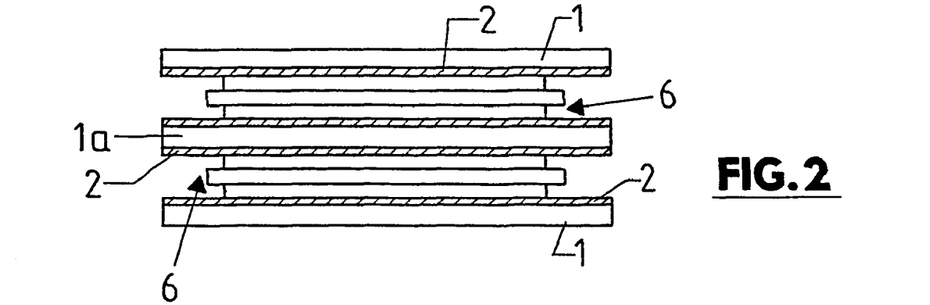
FIG. 2 illustrates a cross-sectional side view of an alternate embodiment of a metal-ceramic substrate of the present invention.

FIG. 2 shows as a further possible embodiment a process in which several double-sided metallized copper-ceramic substrates are manufactured in a stack in one processing step using the DCB process. For this purpose, two base plates 1, each with a porous separating layer 2 are used, in addition to at least one further base plate 1a, which is provided with the porous separating layer 2 on both surfaces.

As depicted, a DCB packet 6 consisting of the bottom copper foil 3, the ceramic layer 4 and the top copper foil 5 is formed on the lower, likewise horizontally oriented base plate 1 or on its separating layer 2. The base or intermediate plate 1a with a surface comprising the separating layer 2 is then placed on this DCB packet 6. A further DCB packet 6 is applied on the other top separating layer 2 of the base plate 1a, on which (DCB packet) the top base plate 1 is placed as a weight plate as depicted in FIG. 2, so that it bears with its separating layer 2 on the top DCB packet 6. Generally it is also possible in this embodiment to provide more than two DCB packets 6 with intermediate base or separating plates 1a.

After completion of the DCB process, i.e. after heating of the array consisting of the DCB packets 6 and the base plates 1/1a to the DCB or bonding temperature and after cooling, the double-sided metallized copper-ceramic substrates obtained from the DCB packets 6 can be removed from the base plates 1 or 1a; in this embodiment the separating layers 2 again prevent inadvertent bonding of the copper foils 3 and 5 to the respective adjacent base plate 1 or 1a.

Figure 3:
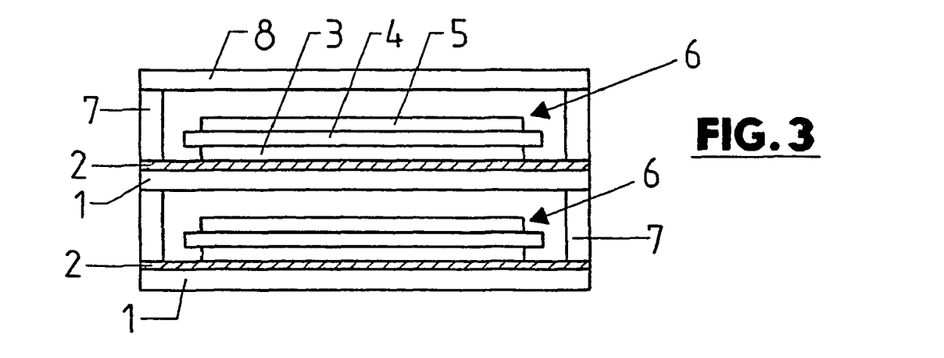
FIG. 3 illustrates a cross-sectional side view of an alternate embodiment of a metal-ceramic substrate of the present invention.

FIG. 3 shows as a further possible embodiment a process in which the copper foils 3 and 5 and the ceramic layer 4 of several, vertically stacked DCB packets 6 are bonded in one processing step to a double-sided metallized copper-ceramic substrate. In the embodiment depicted in FIG. 3, two horizontal base plates 1, which are stacked parallel one above the other, are used. For spacing of the two base plates 1 a frame-like spacing element 7 is used, which likewise is made of a highly temperature-resistant material, preferably of the material that is also used for the base plates 1. A DCB packet 6 is placed on the upper horizontal separating layer 2 of each base plate 1. Above the upper DCB packet 6 and distanced from the upper base plate 1 by a spacer element 7, there is an upper cover plate 8, also made of the highly temperature-resistant material, for example of the material of the base plates 1. The spacer elements 7 are designed so that the top side of the lower DCB packet 6 is distanced from the base plate 1 above it, and the top side of the upper DCB packet 6 is distanced from the cover plate 8 above it.

This embodiment again allows the easy removal of the manufactured double-sided metallized copper-ceramic substrate after completion of the DCB process.

Figure 4:
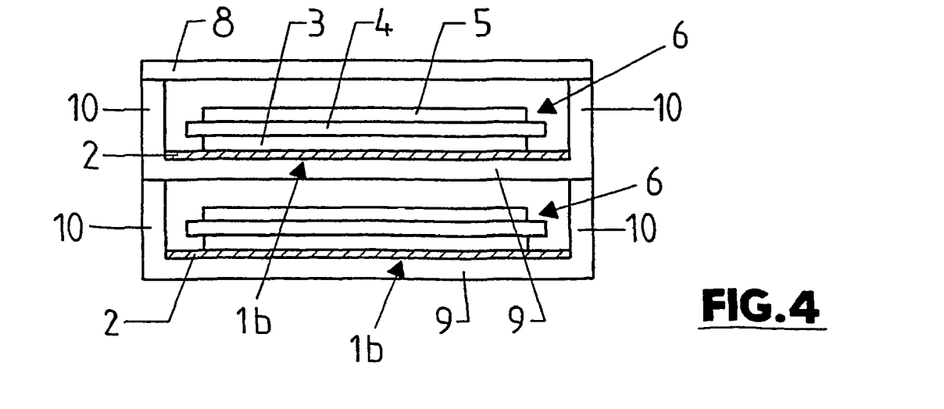
FIG. 4 illustrates a cross-sectional side view of an alternate embodiment of a metal-ceramic substrate of the present invention.

FIG. 4 shows as a further embodiment an array in which, instead of the base plates 1 and spacer elements 7, rectangular or square base plates 1b are used, which are provided on each of at least two opposing sides with a wall section or edge 9 protruding over a bottom 10 and functioning as a spacer. The inside of these trough-shaped or channel-shaped base plates 1b is provided with the separating layer 2 at least on the bottom 10. By stacking the base plates 1b, each of several DCB packets 6 can again be bonded in one processing step to a double-sided metallized copper-ceramic substrate.

Figure 5:
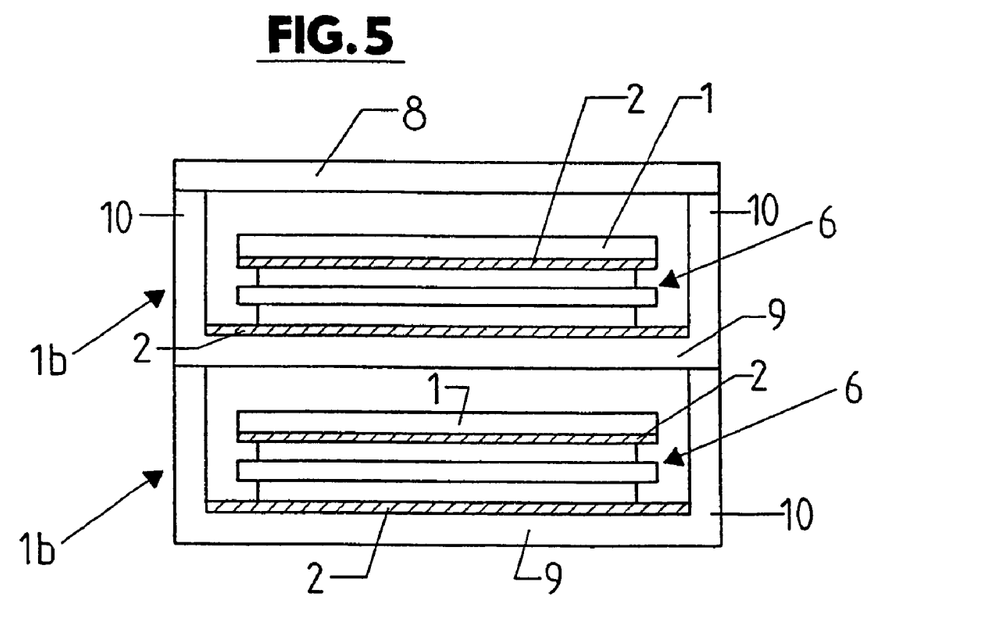
FIG. 5 illustrates a cross-sectional side view of an alternate embodiment of a metal-ceramic substrate of the present invention.

FIG. 5 shows an array that differs from the array of FIG. 4 essentially only in that an additional base plate 1 is placed as an additional weight plate on each DCB packet 6, with the separating layer 2 below, i.e. between the additional base plate and the respective DCB packet. As in the embodiment of FIG. 4, more than two base plates 1b can be stacked in the embodiment of FIG. 5.

Figure 6:
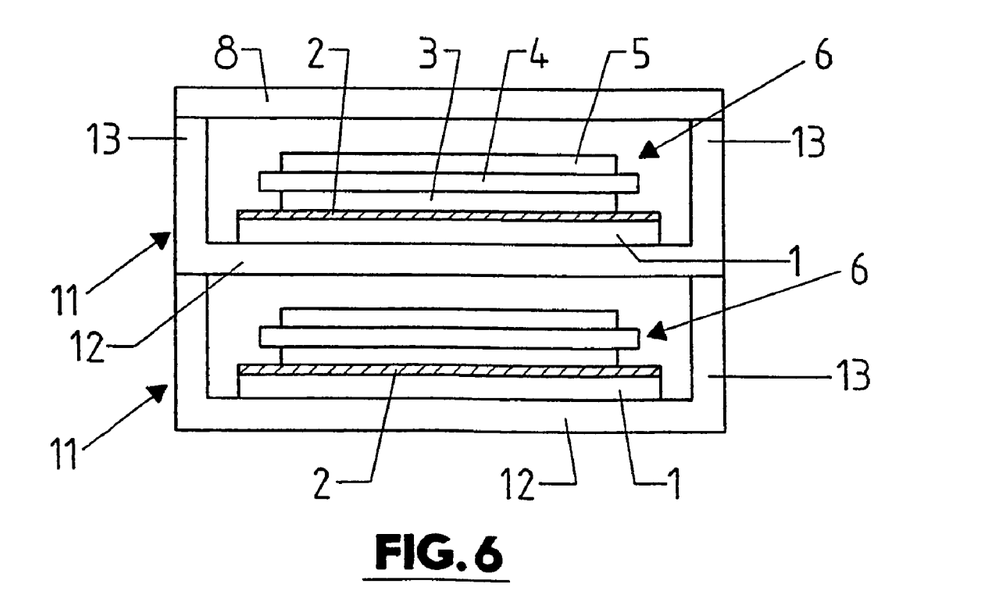
FIG. 6 illustrates a cross-sectional side view of an alternate embodiment of a metal-ceramic substrate of the present invention.

FIG. 6 shows as a further possible embodiment an array in which, instead of the trough-shaped or channel-shaped base plates 1b with the inner separating layer 2, channel-shaped or trough-shaped auxiliary or carrier elements 11 are used, which likewise consist of a square or rectangular, plate-shaped bottom 12 and of walls 13 manufactured as one piece with the bottom, which (walls) protrude on at least two opposing sides of the bottom 12 over a common surface of said bottom and form spacer elements, so that the carrier elements 11 are stacked one above the other and sufficiently spaced with their bottom 12.

For the manufacture of several double-sided metallized copper-ceramic substrates, a base plate 1 is placed in each carrier element 11 so that the respective DCB packet 6 can then be placed on the separating layer 2. Afterwards, the next carrier element 11 is placed on the edges of the carrier element 11 below and then a further DCB packet is placed on the base plate 1 or its separating layer 2 of that carrier element. The top carrier element 11 is again covered with a cover plate 8.

The embodiments of FIG. 3 through 6 have the advantage that especially also the DCB packets 6 at the bottom of the stack array are not subjected to the weight of the DCB packets 6 above, so that the DCB bonding can be reproduced for all DCB packets 6 with the same quality and under the same conditions. Furthermore, it is possible in this embodiment to optimize the oxygen content of the DCB packets within the protective gas atmosphere surrounding the stack array during the DCB process, for example by providing the spacer elements 7 with windows of a defined size, by means of which the spaces formed between the spacer elements 7 and the plates 1 or 8 are connected with the protective gas atmosphere surrounding the stack array during the DCB process.

In the embodiments described above the ceramic layer has a size, for example, greater than 100×100 mm, and the dimension of the sections of the copper foil forming the copper layer or plates 3 and 5 are of approximately the same size. A suitable ceramic for the ceramic layer 4 is for example an aluminum oxide ceramic ($Al_2O_3$) with a zirconium oxide ($ZrO_2$) content of approximately 2-30%, or an aluminum nitride ceramic, for example with yttrium as an additive or a silicon ceramic, wherein the aluminum nitride ceramic and/or silicon nitride ceramic has an oxidic surface layer, for example a surface layer of aluminum oxide. The thickness of the ceramic layer 4 is between approx. 0.2 and 1.5 mm. The thickness of the foils forming the copper layers is between approximately 0.1 and 1.2 mm. Furthermore, it is also generally possible in the embodiments described above that the thickness of the copper layers 3 and 5 is different, and that the ratio of the thickness of the copper layer to the thickness of the ceramic layer 4 is preferably greater than 0.5.

The following table lists advantageous examples for the layer thicknesses of the ceramic layer 4 and the copper layers 3 and 5.

| Combined ceramic layer/copper layer thickness number | Thickness of ceramic layer 4 in mm | Thickness of copper layer 3 or 5 in mm |
| --- | --- | --- |
| 1 | 0.5 | 0.3 |
| 2 | 0.32 | 0.4 |
| 3 | 0.5 | 0.4 |
| 4 | 0.63 | 0.6 |
| 5 | 0.25 | 0.4 |

In a preferred embodiment the thermal expansion coefficient of the respective base plate 1, 1a, 1b differs from the thermal expansion coefficient of the ceramic layer 4, for example by less than +/−10%.

Figure 7:
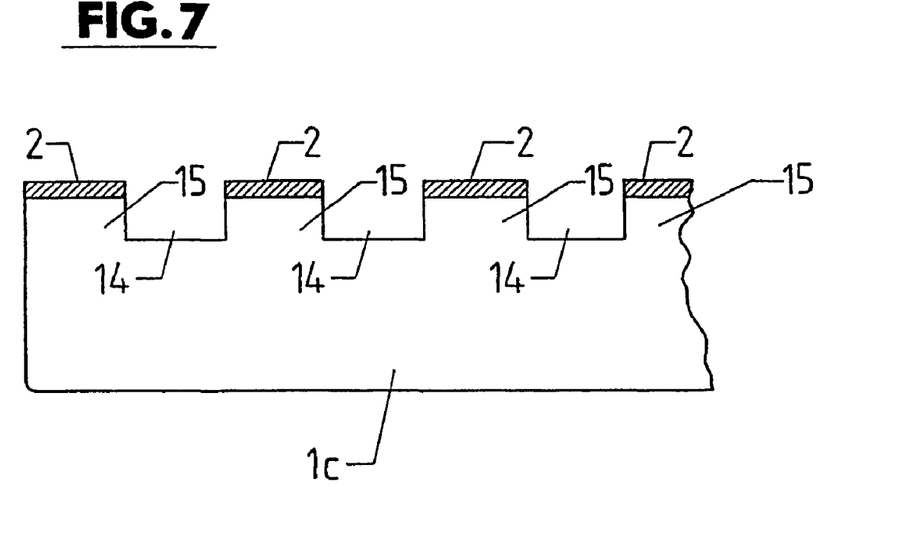
FIG. 7 illustrates a cross-sectional side view of a base plate of the present invention.
Figure 8:
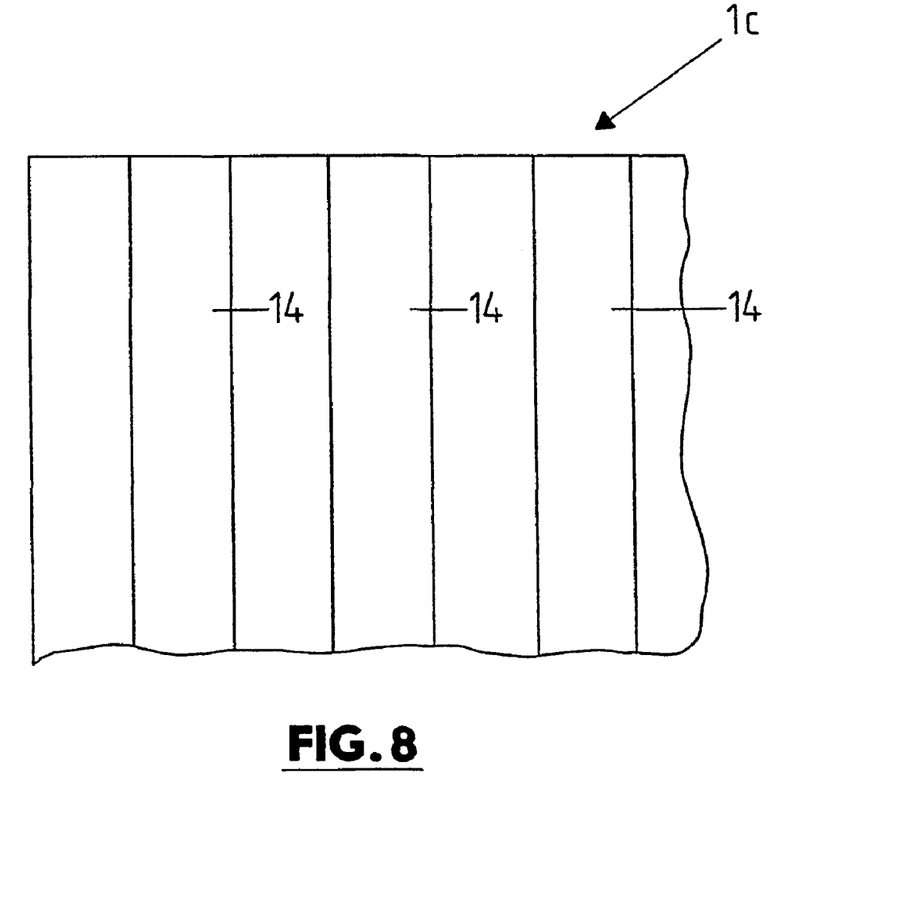
FIG. 8 illustrates a top view of a base plate of the present invention.

FIGS. 7 and 8 show in a simplified depiction in cross section and in top view a base plate 1c, which is structured on a surface, i.e. is provided with a plurality of recesses or grooves 14 distanced from each other and extending parallel to each other and parallel to two circumference sides of the rectangular or square base plate 1c. The separating layer 2 in this embodiment is provided on the raised areas 15 formed between the grooves 14. In actual use, the respective DCB packet 6 or the respective copper plate 3 or 5 bears only against the raised areas 15.

Figure 9:
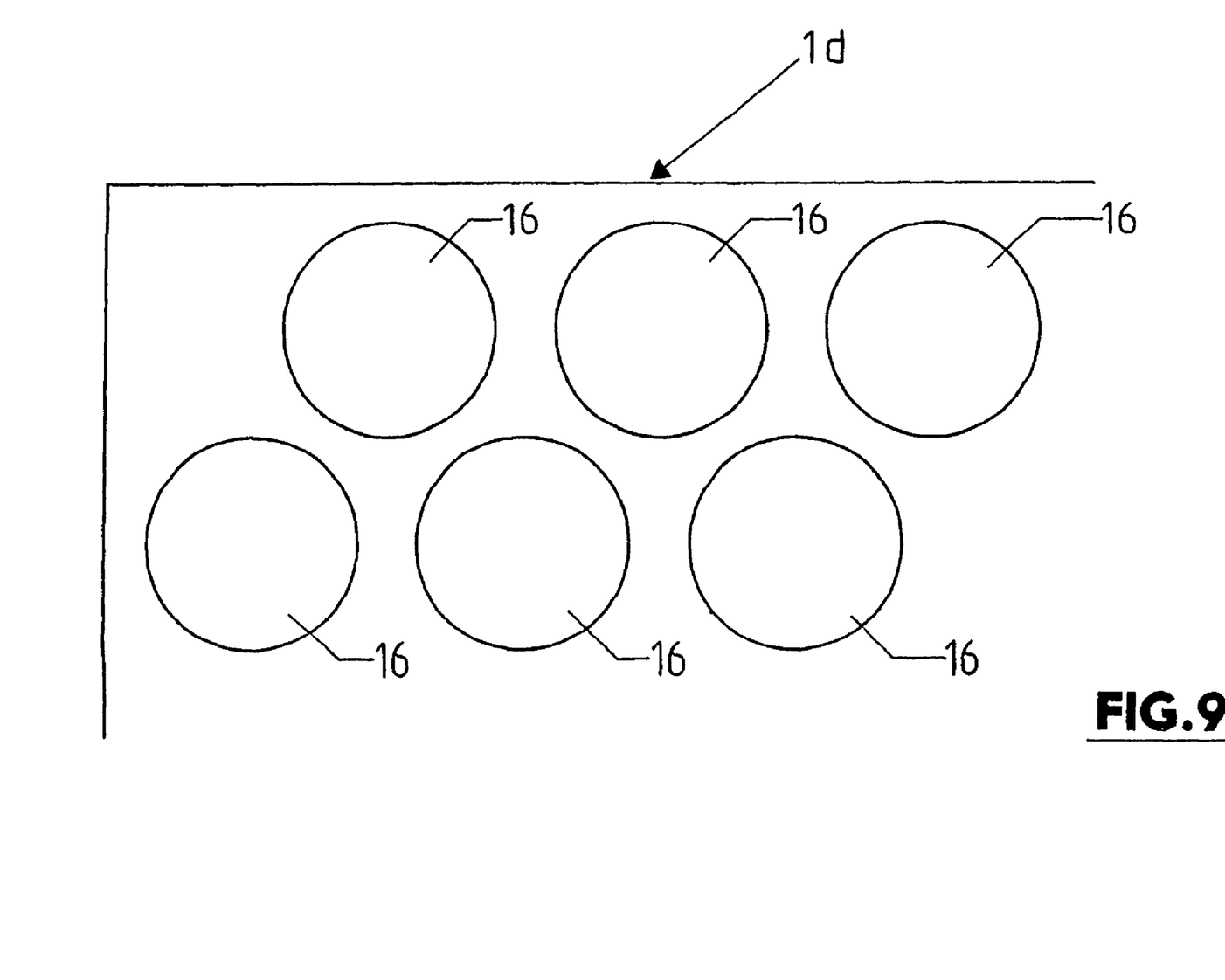
FIG. 9 illustrates a top view of an alternate embodiment of a base plate of the present invention.

Instead of the groove-shaped recesses 14, other recesses 16 can also be provided on the base plate, for example circular recesses, as depicted in FIG. 9 for the base plate 1d. In this embodiment also, only the raised areas between the recesses 16 form support surfaces of the base plate 1d and are provided with the separating layer 2. Furthermore, it is possible to profile the respective base plate on both surfaces, particularly if said base plate is used as an intermediate plate.

The invention is illustrated by the following examples:

Example 1

Two copper layers or copper plates 3 and 5 with the dimensions 130×180 mm and with a thickness of 0.4 mm are provided on both sides with an oxide layer.

A ceramic plate 4 made of $Al_2O_3$ with the dimensions 130×180 mm and with a thickness of 0.32 mm is cleaned, for example with brushes. The thermal expansion coefficient of the ceramic plate is $6.8 \times 10^{-6}/°K$.

The evenness of the ceramic plate 4 is measured by means of two plane-parallel plates and the deviations from an absolute even ceramic plate are less than 0.5 mm.

In order to form the separating layer 2, a layer made of a powdered $Al_2O_3$ material with an average particle size of 10 μm is applied by spreading as an aqueous suspension, with a layer thickness of approximately 1 mm, onto a base plate 1 made of mullite with a thickness of 3 mm.

The base plate is then dried at 150° C.

A DCB packet 6 is applied to the dried base plate, i.e. first, as the lowest layer, the pre-oxidized copper plate 3, followed by the ceramic plate 4 and on top the second, pre-oxidized copper plate 5.

The stack array thus formed is then heated in a furnace in a protective gas atmosphere, for example a nitrogen atmosphere with an oxygen content of $10 \times 10^{-6}$ percent by volume to a DCB temperature of 1072° C.

The stack array is then removed from the furnace and after cooling sufficiently the double-sided metallized DCB or copper-ceramic substrate is separated from the base plate.

The exposed copper surfaces are cleaned by brushing off adhering ceramic particles of the separating layer.

Example 2

Two copper plates 3 and 5 with the dimensions 130×180 mm and with a thickness of 0.4 mm are provided with an oxide layer or pre-oxidized.

A ceramic plate 4 made of $Al_2O_3$ with a thickness of 0.63 mm and with dimensions of 130×180 mm is cleaned by brushing. The thermal expansion coefficient of the $Al_2O_3$ plate is $6.8 \times 10^{-6}/°K$.

The evenness of the ceramic plate 4 is measured by means of two plane-parallel plates and the deviations from an absolute even ceramic plate are less than 0.8 mm.

In order to form the separating layer 2, a layer made of a powdered $Al_2O_3$ material with an average particle size of 10 μm is applied by spreading as an aqueous suspension, with a layer thickness of approximately 1 mm, onto a base plate 1 made of mullite with a thickness of 3 mm.

In order to form the separating layer 2, a layer made of a powdered $Al_2O_3$ material with an average particle size of 10 μm is applied by spreading as an aqueous suspension, with a layer thickness of approximately 1 mm, onto a further base plate 1 (as a weight plate) made of mullite with a thickness of 4 mm.

The base plates are then dried at 150° C.

A DCB packet 6 is applied to the dried first base plate 1, i.e. first, as the lowest layer, the pre-oxidized copper plate 3, followed by the ceramic plate 4 and on top the second, pre-oxidized copper plate 5.

The second base plate 1 is placed as a weight plate on the DCB packet 6. The stack array thus formed is then heated in a furnace in a protective gas atmosphere, for example a nitrogen atmosphere with an oxygen content of $10 \times 10^{-6}$ percent by volume to a DCB temperature of 1072° C. The stack array is then removed from the furnace and after cooling sufficiently the double-sided metallized DCB or copper-ceramic substrate is separated from the base plate.

The copper surfaces of the copper-ceramic substrate are cleaned, for example by chemical etching, of adhering ceramic particles from the separating layer.

Example 3

In this method, the procedure of Example 1 or Example 2 is followed, however with the difference that a total of three base plates made of mullite are prepared, for example two base plates 1 and 1a each with a thickness of 3 mm and a base plate 1 (as a weight plate) with a thickness of 4 mm.

To produce the separating layer 2, a layer consisting of the powdered $Al_2O_3$ material is applied by spreading as an aqueous suspension or mass with a thickness of 1 mm to a surface of the base plates 1 with a thickness of 3 mm.

The layer consisting of the powdered $Al_2O_3$ material with a thickness of 1 mm is applied to both surfaces of the other base plate 1a with a thickness of 3 mm, in order to form an intermediate plate.

To form the separating layer, the aqueous solution or mass consisting of the powdered $Al_2O_3$ material is applied by spreading with a layer thickness of 1 mm to at least one surface of the third base plate 1 with a thickness of 4 mm (weight plate).

The base plates 1 and 1a thus prepared are then dried at 150° C. and the stack array depicted in FIG. 2 is formed using these base plates.

The stack array is then heated in a furnace in a protective gas atmosphere, for example a nitrogen atmosphere with an oxygen content of $10 \times 10^{-6}$ percent by volume to a DCB temperature of 1072° C.

The stack array is then removed from the furnace and after cooling sufficiently the double-sided metallized DCB or copper-ceramic substrate is separated from the base plate.

The copper surfaces of the copper-ceramic substrate are cleaned, for example by brushing and/or chemical etching, of adhering ceramic particles from the separating layer.

Example 4

Two copper layers or copper plates 3 and 5 with the dimensions 130×180 mm and with a thickness of 0.4 mm are provided on both sides with an oxide layer.

A ceramic plate 4 made of $Al_2O_3$ with the dimensions 130×180 mm and with a thickness of 0.32 mm is cleaned, for example with brushes. The thermal expansion coefficient of the ceramic plate is $6.8 \times 10^{-6}$/° K.

The evenness of the ceramic plate 4 is measured by means of two plane-parallel plates and the deviations from an absolute even ceramic plate are less than 0.5 mm.

A base plate 1b made of mullite with a thickness of the bottom 9 of 3 mm is provided on the inside of the bottom 9 with a layer of the powdered $Al_2O_3$ material with an average particle size of 10 μ??(m) contained in an aqueous suspension or mass in order to produce the separating layer 2.

The base plate 1b is then dried at 150° C.

Using the base plate 1b, a stack array similar to the stack array of FIG. 4 is formed, however only with a base plate 1b, a DCB packet 6 within this base plate and a cover plate 8.

The stack array is then heated in a furnace in a protective gas atmosphere, for example a nitrogen atmosphere with an oxygen content of $10 \times 10^{-6}$ percent by volume to a DCB temperature of 1072° C.

The stack array is then removed from the furnace.

After cooling sufficiently, the produced double-sided metallized DCB or copper-ceramic substrate is separated from the base plate.

The exposed copper surfaces are cleaned by brushing off adhering ceramic particles from the separating layer.

Example 5

This example differs from Example 4 in that instead of only one base plate 1b, two base plates 1b are used, namely for forming a stack array as in FIG. 4. Both base plates 1b are provided with a separating layer 2 on the inside of their bottom 9 in the manner described in Example 4.

The stack array is then heated in a furnace in a protective gas atmosphere, for example a nitrogen atmosphere with an oxygen content of $10 \times 10^{-6}$ percent by volume to a DCB temperature of 1072° C.

The stack array is then removed from the furnace.

After cooling sufficiently, the produced double-sided metallized DCB or copper-ceramic substrate is separated from the base plate.

The exposed copper surfaces are cleaned by brushing off adhering ceramic particles from the separating layer.

Example 6

The procedure in this example corresponds to Example 5; however, in addition to the two base plates 1b, two further plates 1 made of mullite with a thickness of 4 mm are used as weight plates. Both plates 1 are provided with the separating layer 2 on at least one surface, namely by applying the pasty or aqueous mass consisting of the powdered $Al_2O_3$ material with a layer thickness of 1 mm.

After drying of the plates 1 and 1b, the stack array with two DCB packets 6 is formed with said plates as in FIG. 6.

The stack array is then heated in a furnace in a protective gas atmosphere, for example a nitrogen atmosphere with an oxygen content of $10 \times 10^{-6}$ percent by volume to a DCB temperature of 1072° C.

After the DCB process and after cooling, the produced DCB or copper-ceramic substrates are removed.

The exposed surfaces are then cleaned of adhering ceramic particles by brushing and/or chemical treatment, etc.

Example 7

Two copper plates 3 and 5 with the dimensions 130×180 mm and with a thickness of 0.4 mm are provided with an oxide layer or pre-oxidized. A ceramic plate 4 made of AlN with a thickness of 0.63 mm and with dimensions of 130×180 mm is cleaned by brushing. The thermal expansion coefficient of the AlN plate is $4 \times 10^{-6}$/° K.

The evenness of the ceramic plate 4 is measured by means of two plane-parallel plates and the deviations from an absolute even ceramic plate are less than 0.8 mm.

In order to form the separating layer 2, a layer made of a powdered $Al_2O_3$ material with an average particle size of 10 μm is applied by spreading as an aqueous suspension, with a layer thickness of approximately 1 mm, onto a base plate 1 made of $Al_2O_3$ with a thermal expansion coefficient of $6.8 \times 10^{-6}$/° K. and with a thickness of 3 mm.

In order to form the separating layer 2, a layer made of a powdered $Al_2O_3$ material with an average particle size of 10 μm is applied by spreading as an aqueous suspension, with a layer thickness of approximately 1 mm, onto a further base plate 1 (as a weight plate) made of $Al_2O_3$ with a thermal expansion coefficient of $6.8 \times 10^{-6}$/° K. and with a thickness of 4 mm.

The base plates are then dried at 150° C.

A DCB packet 6 is applied to the dried first base plate 1, i.e. first, as the lowest layer, the pre-oxidized copper plate 3, followed by the ceramic plate 4 and on top the second, pre-oxidized copper plate 5.

The second base plate 1 is placed as a weight plate on the DCB packet 6. The stack array thus formed is then heated in a furnace in a protective gas atmosphere, for example a nitrogen atmosphere with an oxygen content of $10 \times 10^{-6}$ percent by volume to a DCB temperature of 1072° C. The stack array is then removed from the furnace and after cooling sufficiently the double-sided metallized DCB or copper-ceramic substrate is separated from the base plate.

The copper surfaces of the copper-ceramic substrate are cleaned, for example by brushing and/or chemical etching, of adhering ceramic particles from the separating layer.

Example 8

Two copper layers or copper plates 3 and 5 with the dimensions 130×180 mm and with a thickness of 0.4 mm are provided on both sides with an oxide layer.

A ceramic plate 4 made of $Al_2O_3$ with a $ZrO_2$ content of 20 percent by weight and the dimensions 130×180 mm and with a thickness of 0.32 mm is cleaned, for example with brushes. The thermal expansion coefficient of the ceramic plate is $6.8 \times 10^{-6}/° K$.

The evenness of the ceramic plate 4 is measured by means of two plane-parallel plates and the deviations from an absolute even ceramic plate are less than 0.5 mm.

A total of three base plates made of SiC are prepared, namely two base plates 1 and 1a each with a thickness of 3 mm and a base plate 1 (as a weight plate) with a thickness of 4 mm. To produce the separating layer 2, a layer consisting of the powdered $Al_2O_3$ material is applied by spreading as an aqueous suspension or mass with a thickness of 1 mm to a surface of the base plates 1 with a thickness of 3 mm.

The layer consisting of the powdered $Al_2O_3$ material with a thickness of 1 mm is applied to both surfaces of the other base plate 1a with a thickness of 3 mm, in order to form an intermediate plate. To form the separating layer, the aqueous solution or mass consisting of the powdered $Al_2O_3$ material is applied by spreading with a layer thickness of 1 mm to at least one surface of the third base plate 1 with a thickness of 4 mm (weight plate).

The base plates 1 and 1a thus prepared are then dried at 150° C. and the stack array depicted in FIG. 2 is formed using these base plates.

The stack array is heated in a furnace in a protective gas atmosphere, for example a nitrogen atmosphere with an oxygen content of $10 \times 10^{-6}$ percent by volume to a DCB temperature of 1072° C. The stack array is then removed from the furnace and after cooling sufficiently the double-sided metallized DCB or copper-ceramic substrate is separated from the base plate.

The copper surfaces of the copper-ceramic substrate are cleaned, for example by brushing and/or chemical etching, of adhering ceramic particles from the separating layer.

In the above descriptions it was assumed that the respective separating layers 2 are produced by applying the powdered separating layer material (for example $Al_2O_3$ material etc.) in a mass containing a liquid or aqueous matrix and by subsequent drying and/or removal of a bonding agent at a temperature of 150° C., for example. Generally it is also possible to continue heating the respective separating layer 2 or the base plate 1, 1a, 1b, 1c, 1d comprising said separating layer after drying of the separating layer 2 or removal of the bonding agent, namely to a temperature below the sintering temperature of the separating layer material used for the separating layer 2, in order to strengthen the separating layer 2 by partial sintering of the particles forming said separating layer while maintaining the high porosity of the separating layer (greater than 20%) and thus simplifying the handling of the respective base plate 1, 1a, 1b, 1c, 1d.

The invention was described above based on exemplary embodiments. It goes without saying that numerous modifications and variations are possible without abandoning the underlying inventive idea upon which the invention is based.

REFERENCE LIST

| | |
|---|---|
| 1, 1a-1d | base plate |
| 2 | separating layer |
| 3 | copper foil or plate |
| 4 | ceramic layer or plate |
| 5 | copper foil or plate |
| 6 | DCB packet |
| 7 | frame-like spacer element |
| 8 | cover plate |
| 9 | bottom |
| 10 | edge |
| 11 | carrier element |
| 12 | bottom |
| 13 | edge |
| 14 | recess |
| 15 | raised area |
| 16 | recess |

What is claimed is:

1. A method for manufacturing double-sided metallized metal-ceramic substrates in the form of DCB packets, the method comprising the steps of:

forming at least one DCB packet, the at least one DCB packet comprising a first metal layer and a second metal layer and a ceramic layer located between the first and the second metal layers and the at least one DCB packet is formed by a bonding method wherein the first and the second metal layer are oxidized on both surface sides, placed on the ceramic layer in a nitrogen atmosphere with an oxygen content of $10 \times 10^{-6}$ percent by volume and heated to a bonding temperature of between 1025° C. and 1083° C., so that a surface of the first and second metal layer forms a liquid eutectic with a temperature lower than a melting point of the first and second metal layer, the eutectic facilitates bonding the first metal layer and second metal layer on each side of the ceramic layer, and a separating layer is placed on at least one base plate, the separating layer consisting of a heat resistant material, wherein one of the first and second metal layers of the at least one DCB packet bears against the separating layer, the separating layer is a porous layer made of a separating layer material selected from the group mullite, $Al_2O_3$, $TiO3$, $ZrO_2$, MgO, CaO, $CaCO_2$ or of a combination of at least two of these separating materials, wherein the separating layer has a porosity ratio of pore volume to solid volume greater than 20%, and bonding the first metal layer to the second metal layer with the ceramic layer by heating to a direct bonding temperature to form the at least one DCB packet while the first metal layer, the second metal layer and the ceramic layer are supported on the separating layer which is on the at least one base plate, wherein the base plate is made of a component selected from mullite, $ZrO_2$, $Al_2O_3$, AlN, $Si_3N_4$, SiC or a combination thereof.

2. The method according to claim 1, wherein the base plate is made of a highly temperature resistant metal, alloyed steel, molybdenum, titanium, tungsten or of a combination of at least two of the above components.

3. The method according to claim 1, wherein the separating layer has a thickness between 0.01 and 10 mm.

4. The method according to claim 1, wherein the thickness of the base plate or of a part of the base plate comprising the separating layer is between 0.2 and 10 mm.

5. The method according to claim 1, wherein the base plate acts as a carrier.

6. The method according to claim 1, wherein the base plate has deviations from an ideally even plate which are less than 0.2% of the length of the base plate or less than 0.1% of the width of the base plate.

7. The method according to claim 1, wherein at least one surface of the base plate is coated with a mass, the mass contains the separating layer material in powder form in a liquid matrix, or an aqueous matrix.

8. The method according to claim 7, wherein after application of the mass forming the separating layer, said mass is heated to a temperature greater than 130° C. for drying and removal of a bonding agent.

9. The method according to claim 8, wherein the mass forming the separating layer the base plate is heated to a temperature greater than 150° C. but lower than the sintering temperature of the separating layer material.

10. The method according to claim 1, wherein the separating layer is formed by a powdered separating layer material with a particle size smaller than 30 μm.

11. The method according to claim 1, wherein a thermal expansion coefficient of the material of the at least one base plate differs from a thermal expansion coefficient of the ceramic layer of the at least one DCB packet.

12. The method according to claim 1, wherein the first and the second metal plates are copper plates or copper foils.

13. The method according to claim 1, wherein for the manufacture of several double-sided metallized metal-ceramic substrates, a stack array with at least two DCB packets is formed, of which a lower DCB packet lies on the separating layer of a bottom base plate and a top base plate with a separating layer on each side is provided as a separating plate between the adjacent at least two DCB packets in the stack array.

14. The method according to claim 1, wherein a spacer element made of a material of the base plate and comprising an additional separating layer is provided on the top of the at least one DCB packet.

15. The method according to claim 13, wherein to form the stack array of at least two DCB packets, the at least two DCB packets are provided on base plates arranged on top of each other and that the base plates are distanced from each other by means of spacer elements.

16. The method according to claim 1, wherein for bonding, the at least one DCB packet is contained in a space that is limited at least partially by the base plate carrying said DCB packet.

17. The method according to claim 1, wherein the at least one DCB packet is provided in a trough-shaped or channel-shaped base plate and that at least two channel-shaped or trough-shaped base plates are stacked one on top of the other.

18. The method according to claim 1, wherein the at least one DCB packet is located on a base plate provided with the separating layer in the interior of a trough-shaped or channel-shaped carrier element for the direct bonding, and that the carrier element is made of a heat-resistant material, a ceramic material or the material of the at least one base plate.

19. The method according to claim 1, wherein the base plate is structured on at least one of the sides comprising the separating layer.

20. The method according to claim 1, wherein the ceramic of the ceramic layer of the at least one DCB packet is made of $Al_2O_3$ with a $ZrO_2$ content between 2 and 30%.

21. The method according to claim 1, wherein the ceramic layer of the at least one DCB packet is made of aluminum nitride (AlN) or silicon nitride ($Si_3N_4$), with an oxidic surface layer, made of aluminum oxide ($Al_2O_3$).

22. The method claim 1, wherein dimensions of the at least one ceramic layer are greater than 100 mm×100 mm.

23. The method according to claim 1, wherein a thickness of the ceramic layer of the at least one DCB packet is between 0.2 and 1.5 mm.

24. The method according to claim 1, wherein a thickness of the first and second metal layers of the at least one DCB packet is between 0.1 and 1.2 mm.

25. The method according to claim 1, wherein a ratio of the thickness of the first and second metal layers to the thickness of the ceramic layer of the at least one DCB packet is greater than 0.5.

26. The method according to claim 1, wherein a thickness of the first and second metal layers of the at least one DCB packet is different.

27. A method for manufacturing double-sided metallized metal-ceramic substrates in the form of DCB packets, the method comprising the steps of:
forming at least one DCB packet consisting of a first metal layer and a second metal layer of oxidized copper and a ceramic layer located between the first and the second metal layers and the at least one DCB packet is formed by a bonding method wherein the first and the second metal layer are oxidized on both surface sides, placed on the ceramic layer in a nitrogen atmosphere with an oxygen content of $10\times10^{-6}$ percent by volume and heated to a bonding temperature of between 1025° C. and 1083° C., so that a surface of the first and second metal layer forms a liquid eutectic with a temperature lower than a melting point of the first and second metal layer, the eutectic facilitates bonding the first metal layer and second metal layer on each side of the ceramic layer, and a separating layer is placed on at least one base plate, the separating layer consisting of a heat resistant material, wherein one of the metal layers of the at least one DCB packet bears against the separating layer, wherein the separating layer has a porosity ratio of pore volume to solid volume greater than 20%,
the separating layer being a porous layer made of a separating layer material from the group mullite, $Al_2O_3$, $TiO_3$, $ZrO_2$, MgO, CaO, $CaCO_2$ or from a combination of at least two of these separating layer materials, and
bonding the first metal layer and second metal layer together with the ceramic layer by heating to the DCB-bonding temperature to form the at least one DCB packet while the first metal layer, the second metal layer and the ceramic layer are supported on the separating layer on the at least one base plate, wherein the base plate is made of a component selected from mullite, $ZrO_2$, $Al_2O_3$, AlN, $Si_3N_4$, SiC or a combination thereof.

* * * * *